United States Patent [19]
Kim et al.

[11] Patent Number: 5,736,868
[45] Date of Patent: Apr. 7, 1998

[54] EXCLUSIVE OR/NOR GATE CIRCUIT

[75] Inventors: Hyoung-Gon Kim; Yong-Moo Kwon, both of Seoul; Seung-Ho Oh, Seongnam, all of Rep. of Korea

[73] Assignee: Korea Institute of Science and Technology, Seoul, Rep. of Korea

[21] Appl. No.: 678,713

[22] Filed: Jul. 11, 1996

[30] Foreign Application Priority Data

Nov. 28, 1995 [KR] Rep. of Korea ............... 1995-44222

[51] Int. Cl.[6] .................................................. H03K 19/094
[52] U.S. Cl. ........................... 326/55; 326/52; 326/54
[58] Field of Search ............................ 326/52, 54, 55, 326/121, 122

[56] References Cited

U.S. PATENT DOCUMENTS

| | | | |
|---|---|---|---|
| 3,683,202 | 8/1972 | Schmidt, Jr. | 326/55 |
| 4,041,326 | 8/1977 | Robinson | 326/52 |
| 4,417,161 | 11/1983 | Uya | 326/55 |
| 4,424,460 | 1/1984 | Best | 326/54 |
| 4,713,790 | 12/1987 | Kloker et al. | 326/55 |
| 4,718,035 | 1/1988 | Hara et al. | 326/52 |
| 5,334,888 | 8/1994 | Bodas | 326/52 |
| 5,568,067 | 10/1996 | McDermott et al. | 326/55 |

Primary Examiner—Tan T. Nguyen
Attorney, Agent, or Firm—Scully, Scott, Murphy & Presser

[57] ABSTRACT

An exclusive OR/NOR gate circuit which is capable of achieving a low power consumption, a reliable operation, and a fast operation speed, and of being operated irrespective of any kind of process and in accordance with any value of two input signals, that is, being full-swung at a low power, having no necessity of an inverter circuit for an input signal and an additional output circuit by using NOR/NAND gates, and consequently of being adapted to any field requiring a low power and a high efficiency operation.

2 Claims, 2 Drawing Sheets

EXCLUSIVE OR/NOR GATE CIRCUIT

BACKGROUND OF THE INVENTION

1. Field of the Invention

The present invention relates to an exclusive OR/NOR gate circuit, and in particular to an exclusive OR/NOR gate circuit requiring low power and achieving high performance which is capable of being operated irrespective of any process and in accordance with any value of two input signals, thus having no necessity of an inverter circuit for an input signal or an additional circuit for an output terminal.

2. Description of the Conventional Art

FIG. 1 is an exemplary circuit diagram of an exclusive OR gate according to the conventional art. As shown in FIG. 1, an input signal(A) is inputted to the a transmission gate formed of a PMOS transistor PM1 and an NMOS transistor NM1 the gates of which are respectively applied with an input signal(B) and an inverted input signal(/B), and an inverted input signal(/A) is inputted to a transmission gate formed of a PMOS transistor PM2 and an NMOS transistor NM2 the gates of which are applied with the inverted input signal(/B) and the input signal(B), respectively.

Therefore, when input signals(A)(B) are different from each other, the PMOS transistor PM1 and the NMOS transistor NM1 or the PMOS transistor PM2 and the NMOS transistor NM2 are turned on, and as a result a high level output signal(OUT) is outputted in accordance with the high level input signal(A) or high level inverted input signal(/A). When the input signals(A,B) are identical, the PMOS transistor PM2 and the NMOS transistor NM2 or the PMOS transistor PM1 and the NMOS transistor NM1 are turned on and consequently a low level output signal(OUT) is outputted in accordance with the low level inverted input signal(/A) or the low level input signal(A).

But, as described above, the conventional exclusive OR gate circuit has no capability of operating a next circuit stage since the circuit is composed only of a pair of transmission gates, and an additional inverter circuit is needed to provide inverted versions of the input signal.

FIG. 2 is a exemplary circuit diagram of an exclusive OR gate according to the conventional art. As shown in FIG. 2, in order to complement the operating capability of the circuit in FIG. 1, an inverter circuit including a PMOS transistor PM3 and an NMOS transistor NM3 is connected to an output terminal, and an input signal(B) is applied to the gates of the NMOS transistor NM1 and PMOS transistor PM2, and an inverted input signal(/B) is applied to the gates of the PMOS transistor PM1 and the NMOS transistor NM2.

Therefore, when the input signals are different from each other, the PMOS transistor PM2 and the NMOS transistor NM2 or the PMOS transistor PM1 and the NMOS transistor NM1 are turned on, and a low level signal is outputted in accordance with a low level inverted input signal(/A) or a low level input signal(A), and after the low level output signal is inverted by the inverter circuit including the PMOS transistor PM3 and the NMOS transistor NM3, a high level output signal(OUT) is outputted. When the input signals are identical, a low level output signal(OUT) is outputted, by the circuit being operated conversely to the above described operation.

But, the conventional circuit still has a problem that it is necessary to have an additional circuit in order to get inverted versions of the input signal.

FIG. 3 is an exemplary circuit diagram of another exclusive OR gate according to the conventional art. As shown in this diagram, an input signal(A) is applied to the gates of a PMOS transistor PM4 and an NMOS transistor NM4 connected in series between the voltage supply(Vdd) and voltage ground(Vss), and an input signal(B) is applied to the gates of a PMOS transistor(PM5) and an NMOS transistor (NM5) connected in series between a gate connecting point and a drain connecting point of the PMOS transistor PM4 and the NMOS transistor NM4, and an output signal(OUT) is outputted from a drain connecting point of the PMOS transistor(PM5) and the NMOS transistor(NM5).

Therefore, when the input signals(A,B) are identical, the PMOS transistors(PM4,PM5) or the NMOS transistors (NM4,NM5) are turned on, and a low level output signal (OUT) is outputted. When input signals(A)(B) are different, the PMOS transistor(PM4) and the NMOS transistor(NM5) or the PMOS transistor(PM5) and the NMOS transistor (NM4) are turned on, and a high level output signal(OUT) is outputted.

But, according to the conventional exclusive OR gate circuit, when the input signal(A) is high level and the input signal(B) is low level, a high level output signal which is the voltage supply(Vdd) must be outputted, but since the voltage outputted by the NMOS transistor is equal to Vdd minus the threshold voltage Vtn; i.e. Vdd−Vtn, a predetermined required amount of voltage is not transmitted to the next circuit stage, which causes operational reliability to decrease and an unnecessary current consumption. At this time, if a voltage of Vdd−Vtn is inputted into the next circuit stage, an NMOS transistor is strongly operated, but in the case of a PMOS transistor, since the value of a difference voltage (Vgs) between the gate and source of a MOS transistor is Vdd−Vtn−Vdd=−Vtn, when the absolute value of this voltage is larger than the absolute value of the threshold voltage (Vtp) of a PMOS transistor, the PMOS transistor is also operated according to the characteristics of a MOS transistor. But, this operation causes a consumption of a current flowing from the voltage supply(Vdd) to voltage ground (Vss), and accordingly since there is bound to be a restriction to the threshold voltage of the NMOS transistor and the PMOS transistor, the circuit operational reliability depends on the circuit manufacturing process to a significant degree, and much current is consumed, and thus such circuit is not appropriate for low voltage operation.

FIG. 4 is a fourth exemplary circuit diagram of another exclusive OR gate circuit according to the conventional art. As shown in this drawing, the input signals(A,B) are respectively applied to the gates of PMOS transistors(PM6)(PM7) connected in series to a voltage supply(Vdd), and the input signals(A,B) are also applied to the gates of NMOS transistors(NM6)(NM7), and are commonly applied to the other side of the PMOS transistors(PM6, PM7) connected in series through the NMOS transistors(NM6, NM7), respectively and a signal of the connecting point is outputted through an inverter circuit including PMOS transistor(PM8) and NMOS transistor(NM8).

When the input signals(A,B) are identical, PMOS transistors(PM6,PM7) or NMOS transistors(NM6,NM7) are turned on and a high level signal is inputted to the inverter circuit including the PMOS transistor(PM8) and the NMOS transistor(NM8), and as a result, a low level output signal (OUT) is outputted. When the input signals(A,B) are different, one of the PMOS transistors (PM6,PM7) connected in series with each other is turned off and one of the NMOS transistors(NM6,NM7) is turned on, and as a result a low level signal is inputted into the inverter circuit including PMOS transistor(PM8) and NMOS transistor (NM8), and then a low level output signal is outputted therefrom.

But, the above-mentioned conventional circuit has a problem with respect to the operational reliability and high current consumption, which results from the fact that the voltage of the input terminal of an inverter circuit cannot swing fully. When the input signals(A,B) are different, the voltage at the input terminal of the inverter circuit is equal to the threshold voltage(Vtp) of the PMOS transistor, not the voltage ground(Vss), and consequently since the NMOS transistor in the inverter circuit which is not to be operated is undesirably turned on to a small degree, current is unnecessarily consumed.

SUMMARY OF THE INVENTION

Accordingly, it is an object of the present invention to provide an improved exclusive OR/NOR gate circuit which is capable of being operated irrespective of any process and in accordance with any value of two input signals, that is, capable of fully swinging an operation voltage with a low power, having no necessity of an inverter circuit for an input signal by using NOR/NAND gates nor of an additional circuit of an output signal.

To achieve the above object, there is provided an exclusive OR gate circuit including first and second PMOS transistors respectively connected between an input terminal and an output terminal for respectively receiving first and second input signals, first and second NMOS transistors the gates of which are respectively applied with the second and first input signal and which are connected in series between the output terminal and ground, a NOR gate which NORs the first and second input signals, and a third NMOS transistor the gate of which is applied with an output signal of the NOR gate and which is connected between the output terminal and ground. And there is also provided an exclusive NOR gate circuit which includes, first and second NMOS transistors the gates of which are respectively applied with first and second input signals and which are respectively connected between an output terminal and an input terminal for the first and second input signals, first and second PMOS transistors the gate of which are applied with the second and first input signals and which are connected in series between a voltage supply terminal and the output terminal, a NAND gate which NANDs the first and second input signals, and a third PMOS transistor the gate of which is applied with an output signal of the NAND gate and which is connected between the voltage supply terminal and the output terminal.

DETAILED DESCRIPTION OF THE PREFERRED EMBODIMENTS

The preferred embodiments of the present invention will be described in detail with reference to the accompanying drawings.

Figure 1:
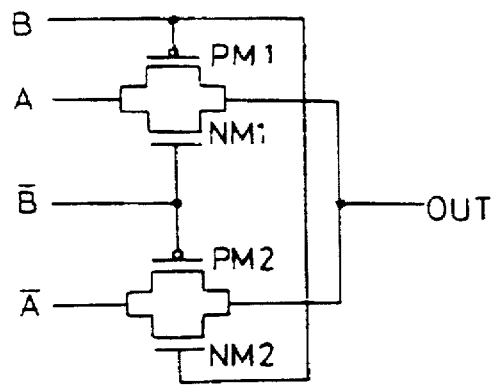
FIG. 1 is an exemplary circuit diagram of a first exclusive OR gate according to the conventional art.
Figure 2:
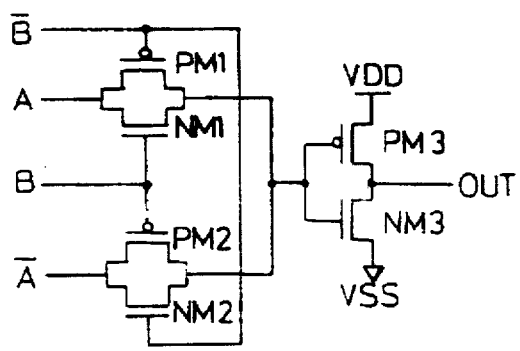
FIG. 2 is an exemplary circuit diagram of a second exclusive OR gate according to the conventional art.
Figure 3:
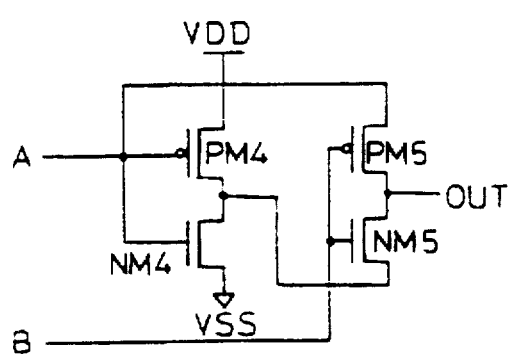
FIG. 3 is an exemplary circuit diagram of a third exclusive OR gate according to the conventional art.
Figure 4:
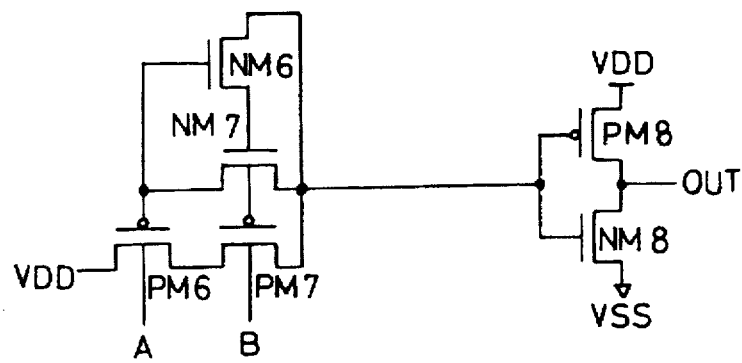
FIG. 4 is an exemplary circuit diagram of a fourth exclusive OR gate according to the conventional art.
Figure 5:
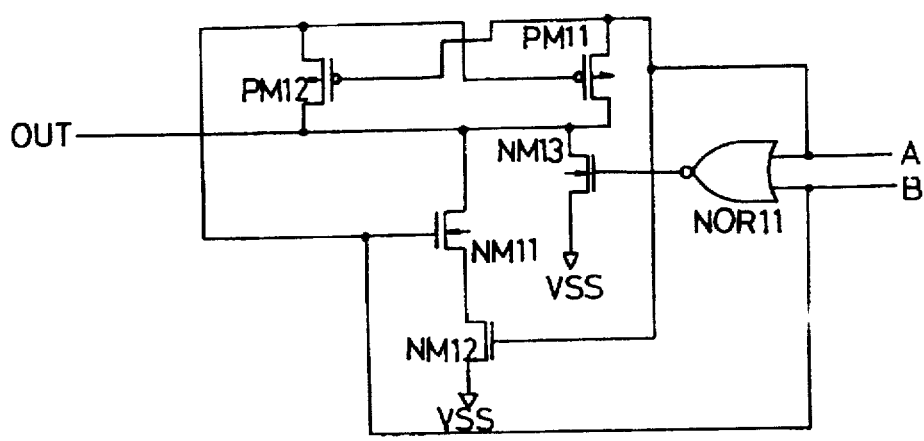
FIG. 5 is a circuit diagram of an exclusive OR gate according to the present invention.

FIG. 5 is a circuit diagram of an exclusive OR gate according to the present invention. As shown in this diagram, the construction of the circuit is connected in the following manner. An input signal(A) is applied at a first input terminal connected to the source of a PMOS transistor (PM11) and to the gates of PMOS transistor(PM12) and NMOS transistor(NM12). An input signal(B) is applied at a second input terminal connected to the source of the PMOS transistor(PM12) and to the gates of the PMOS transistor (PM11) and the NMOS transistor(NM11). At the same time the input signals(A,B) are applied to an input terminal of a NOR gate(NOR11), and an output terminal thereof is connected to the gate of an NMOS transistor(NM13). The drains of the PMOS transistors(PM11,PM12) are commonly connected, and between the common drain connecting point and ground, the NMOS transistors(NM11,NM12) are connected in series while the NMOS transistor(NM13) is connected to the common drain connecting point. An output signal(OUT) is outputted from an output terminal connected between the common drain connecting point of the PMOS transistors(PM11, PM12) and the NMOS transistors(NM11, NM13).

Figure 6:
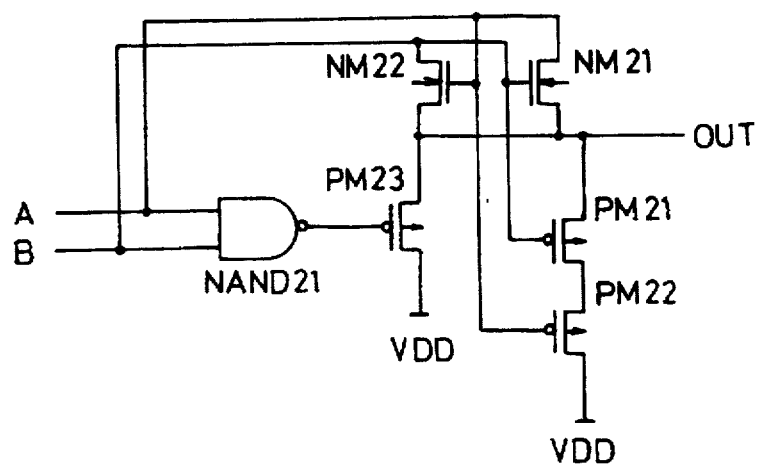
FIG. 6 is a circuit diagram of an exclusive NOR gate according to the present invention.

As shown in the circuit diagram of an exclusive NOR gate circuit in FIG. 6, the PMOS transistors(PM11, PM12) in the circuit of FIG. 5 are replaced by NMOS transistors(NM11 through NM13), the NMOS transistors(NM21 through NM 23) are replaced by PMOS transistors(PM21 through PM 23), and the NOR gate(NOR11) is replaced by a NAND gate(NAND21). This circuit in FIG. 6 is constructed identically to the circuit in FIG. 5, and the operation of the present invention will be described in more detail.

As shown in the exclusive OR gate circuit diagram in FIG. 5, when the input signals(A,B) are different, in other words, when one input signal(A) is high level and the other input signal(B) is low level, or vice versa, the PMOS transistor(PM11) or the PMOS transistor(PM12) is turned on, and the NMOS transistor(NM11) or the NMOS transistor(NM12) is turned off, and as a result in accordance with a low level signal being outputted, the NMOS transistor (NM13) is turned off. Therefore, at this time, the high level input signal(A) or the high level input signal(B) passes through the PMOS transistor(PM11) or the PMOS transistor (PM12) which is turned on, and a high level output signal (OUT) is outputted.

In addition, when the input signals(A,B) are identical, that is, when the input signals(A,B) are both high level, the PMOS transistors(PM12,PM11) are both turned off, and the NMOS transistors(NM12,NM11) are both turned on, and as a result, a low level output signal(OUT) which is the voltage ground is outputted.

And, when the input signals are both low level, the NMOS transistors(NM12,NM11) are turned off, and the PMOS transistors(PM12,PM11) are turned on, and an undesired condition occurs in that a threshold voltage(Vtp) of the PMOS transistors still appears at the PMOS transistors (PM12,PM11) but here, since a high level signal is outputted from the NOR gate(NOR11) and the NMOS transistor (NM13) is turned on, a low level output signal(OUT) is outputted therefrom. That is, the threshold voltage(Vtp) of the PMOS transistors is complemented by the voltage ground, and consequently the voltage of the output signal (OUT) is made a fully swung voltage.

Meanwhile, the exclusive NOR gate circuit is operated conversely to the above-mentioned exclusive OR gate circuit in FIG. 5. That is, when the input signals(A,B) are different, a low level output signal(OUT) is outputted, and when the input signals(A,B) are identical, a high level output signal is outputted.

In other words, when an input signal(A) is high level and an input signal(B) is low level, or vice versa, NMOS transistor (NM22) or NMOS transistor(NM21) is turned on, and PMOS transistor(PM22) or PMOS transistor(PM21) is turned off, and consequently a high level signal is outputted from the NAND gate(NAND21), and then PMOS transistor (PM23) is turned off, so that a low level output signal(OUT) is outputted in accordance with a low level input signal(B) or a low level input signal(A). In addition, when the input signals(A,B) are both low level, since the NMOS transistors (NM22,NM21) are turned off and the PMOS transistors (PM22,PM21) are both turned on, a high level output signal(OUT) is outputted in accordance with the voltage supply(Vdd). But, when the input signals(A,B) are both high level, the NMOS transistors(NM22,NM21) are both turned on and the PMOS transistors(PM22,PM21) are both turned off. But, here, since a low level signal is outputted from the NAND gate(NAND21) and the PMOS transistor(PM23) is turned on, a high level output signal(OUT) is outputted in accordance with the voltage supply(Vdd).

As described in detail above, since the present invention does not employ an inverted input signal, it has no necessity of an inverter circuit for the input signals, nor of an additional circuit for an output terminal. As a result, the circuit construction is made simpler, and it is operated irrespective of any kind of process since the output voltage is made fully swung, and has the effect that it is operated in accordance with any value of the two input signals. Besides, since the circuit according to the present invention is operated at a high speed with a low power consumption by fully swinging the output voltage, it is capable of efficiently being adapted to any field of a circuit which requires a low power consumption and a high operation reliability.

What is claimed is:

1. An exclusive OR gate circuit comprising;

first and second PMOS transistors connected between an input terminal and an output terminal for respectively receiving first and second input signals;

first and second NMOS transistors the gates of which are respectively applied with the second and first input signals and which are connected in series between the output terminal and ground;

a NOR gate which NORs the first and second input signals; and a third NMOS transistor the gate of which is applied with an output signal of the NOR gate and which is connected between the output terminal and ground.

2. An exclusive NOR gate circuit comprising;

first and second NMOS transistors the gates of which are respectively applied with first and second input signals and which are respectively connected between an output terminal and an input terminal for the first and second input signals;

first and second PMOS transistors the gates of which are applied with the second and first input signals respectively and which are connected in series between a voltage supply terminal and the output terminal;

a NAND gate which NANDs the first and second input signals; and a third PMOS transistor the gate of which is applied with an output signal of the NAND gate and which is connected between the voltage supply terminal and the output terminal.

* * * * *